US009373732B2

(12) United States Patent
Velichko

(10) Patent No.: US 9,373,732 B2
(45) Date of Patent: Jun. 21, 2016

(54) IMAGE SENSORS WITH REFLECTIVE OPTICAL CAVITY PIXELS

(71) Applicant: Semiconductor Components Industries, LLC, Phoenix, AZ (US)

(72) Inventor: Sergey Velichko, Boise, ID (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 337 days.

(21) Appl. No.: 13/746,211

(22) Filed: Jan. 21, 2013

(65) Prior Publication Data
US 2013/0200251 A1 Aug. 8, 2013

Related U.S. Application Data

(60) Provisional application No. 61/596,146, filed on Feb. 7, 2012.

(51) Int. Cl.
| | |
|---|---|
| *H01L 27/00* | (2006.01) |
| *H01J 3/14* | (2006.01) |
| *H01L 31/0232* | (2014.01) |
| *H01L 27/146* | (2006.01) |
| *H01L 31/18* | (2006.01) |

(52) U.S. Cl.
CPC .... *H01L 31/02327* (2013.01); *H01L 27/14629* (2013.01); *H01L 27/14685* (2013.01); *H01L 31/18* (2013.01); *H01L 27/1464* (2013.01); *H01L 27/14621* (2013.01); *H01L 27/14625* (2013.01)

(58) Field of Classification Search
CPC ............... H01L 31/00; H01L 31/0232; H01L 31/02327; H01L 31/18; H01L 27/00; H01L 27/14629; H04N 5/335

USPC ......... 250/208.1, 214, 216, 226; 257/14, 19, 257/21, 98, 291, 294, 225–234, 257, 258, 257/290–234, 414, 431–466; 438/72, 438/E05.024, E31.127, 69, 57, 65; 348/294–324, 335–340

See application file for complete search history.

(56) References Cited

U.S. PATENT DOCUMENTS

| | | | |
|---|---|---|---|
| 5,444,270 A | 8/1995 | Cunningham et al. | |
| 5,952,645 A * | 9/1999 | Wang et al. | ............... 250/208.1 |
| 6,157,042 A | 12/2000 | Dodd | |
| 6,498,336 B1 * | 12/2002 | Tian et al. | ................. 250/214.1 |

(Continued)

OTHER PUBLICATIONS

U.S. Appl. No. 13/746,211.*

*Primary Examiner* — Pascal M Bui Pho
(74) *Attorney, Agent, or Firm* — Treyz Law Group, P.C.; Joseph F. Guihan

(57) ABSTRACT

An image sensor may be provided having a pixel array that includes optical cavity image pixels. An optical cavity image pixel may include a photosensitive element in a substrate and a reflective cavity formed from a frontside reflector that is embedded in an intermetal dielectric stack, a backside reflector formed in a dielectric layer above the photosensor that partially covers the photosensor, and sidewall reflectors formed in the substrate between adjacent photosensors using deep trench isolation techniques. Each optical cavity image pixel may also include a light-guide trench above the photosensor that guides light into the reflective cavity for that pixel. Each optical cavity pixel may also include color filter material in the trench. Light that is guided into the reflective cavity by the light-guide trench may experience multiple reflections from the reflectors of the reflective cavity before being absorbed and detected by the photosensor.

18 Claims, 12 Drawing Sheets

(56) References Cited

U.S. PATENT DOCUMENTS

| | | | |
|---|---|---|---|
| 7,072,093 B2 | 7/2006 | Piehl et al. | |
| 7,193,289 B2 * | 3/2007 | Adkisson | H01L 21/76819 257/292 |
| 7,566,942 B2 | 7/2009 | Viens et al. | |
| 7,709,775 B2 * | 5/2010 | Konno | H01L 27/14643 250/208.1 |
| 7,989,859 B2 * | 8/2011 | Mao et al. | 257/292 |
| 8,674,283 B2 * | 3/2014 | Roy et al. | 250/208.1 |
| 2005/0274871 A1 * | 12/2005 | Li et al. | 250/208.1 |
| 2007/0194356 A1 * | 8/2007 | Moon | H01L 27/14625 257/291 |
| 2008/0036020 A1 * | 2/2008 | Ko et al. | 257/431 |
| 2009/0050947 A1 * | 2/2009 | Dungan et al. | 257/294 |
| 2009/0194671 A1 * | 8/2009 | Nozaki et al. | 250/208.1 |
| 2009/0295953 A1 * | 12/2009 | Nozaki | 348/294 |
| 2011/0032398 A1 * | 2/2011 | Lenchenkov | 348/294 |
| 2011/0089514 A1 * | 4/2011 | Tay | H01L 27/14603 257/432 |
| 2011/0090384 A1 * | 4/2011 | Yamada | H01L 27/14625 348/294 |
| 2011/0102651 A1 * | 5/2011 | Tay | H01L 27/14625 348/280 |
| 2011/0108938 A1 * | 5/2011 | Nozaki et al. | 257/432 |
| 2011/0116078 A1 * | 5/2011 | Cho et al. | 356/51 |
| 2011/0281391 A1 * | 11/2011 | Itahashi | 438/69 |
| 2012/0050554 A1 * | 3/2012 | Levine et al. | 348/216.1 |

* cited by examiner

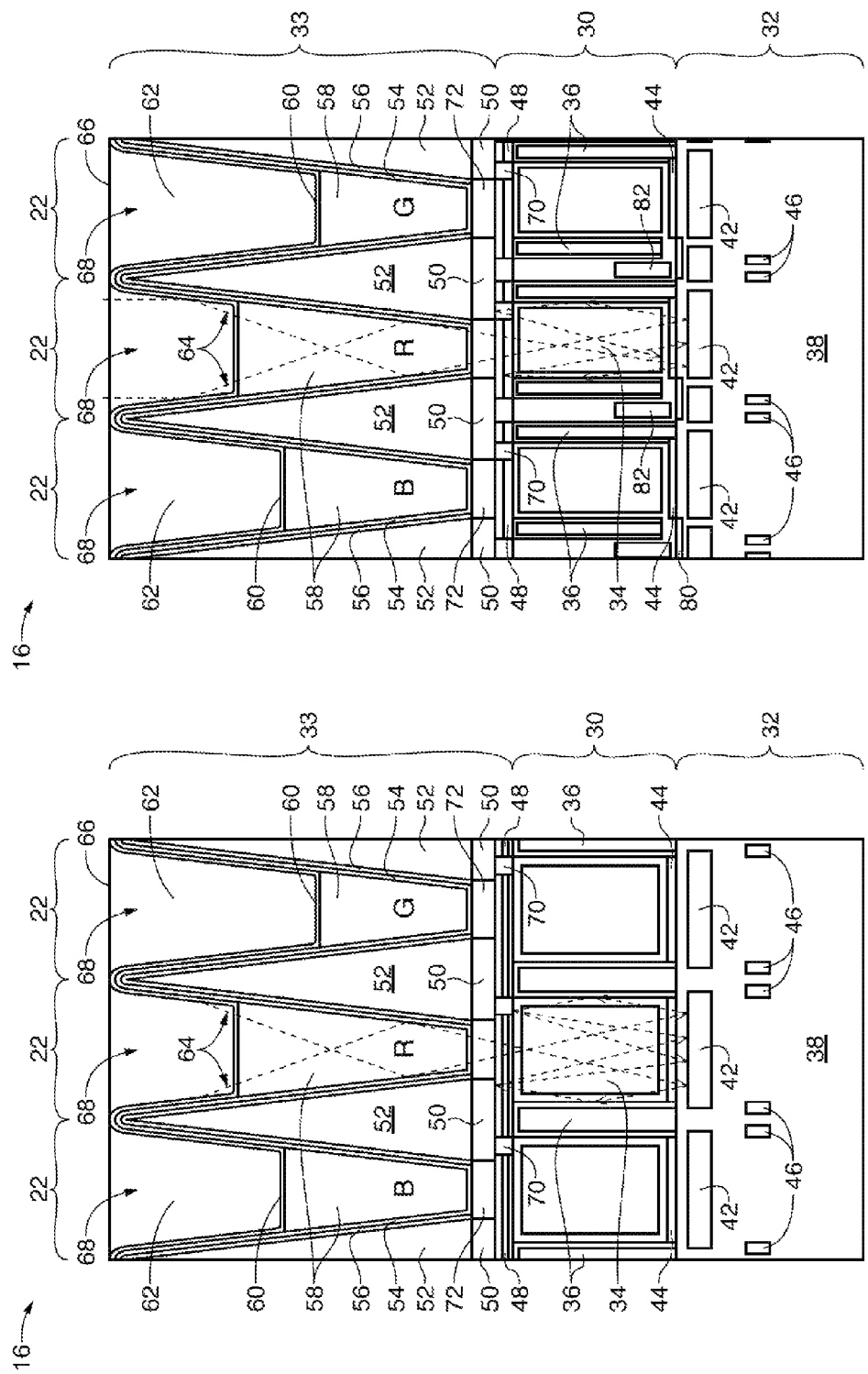

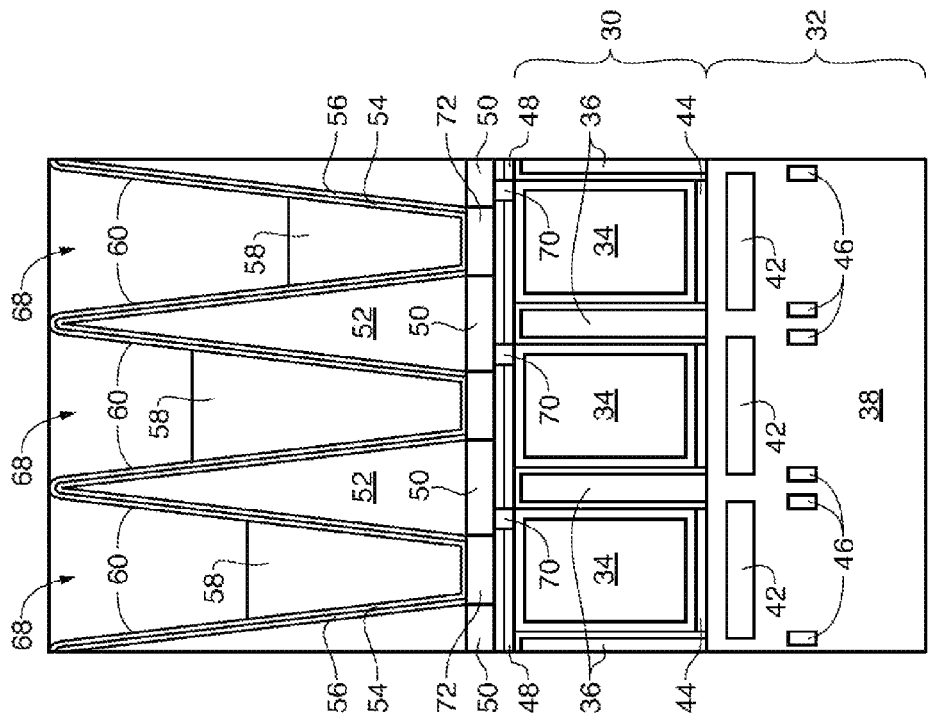
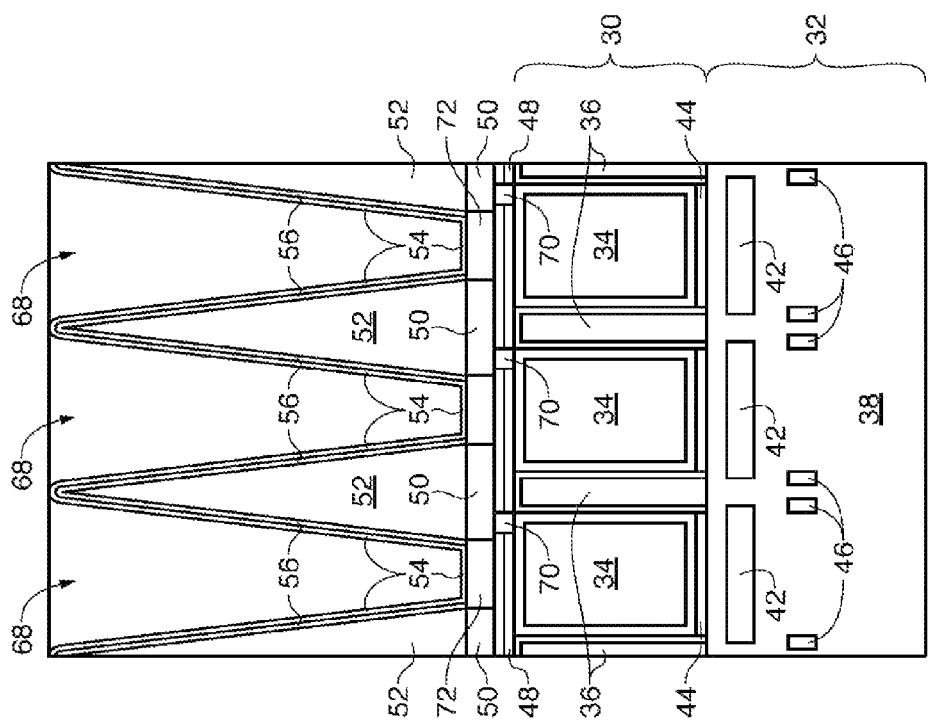

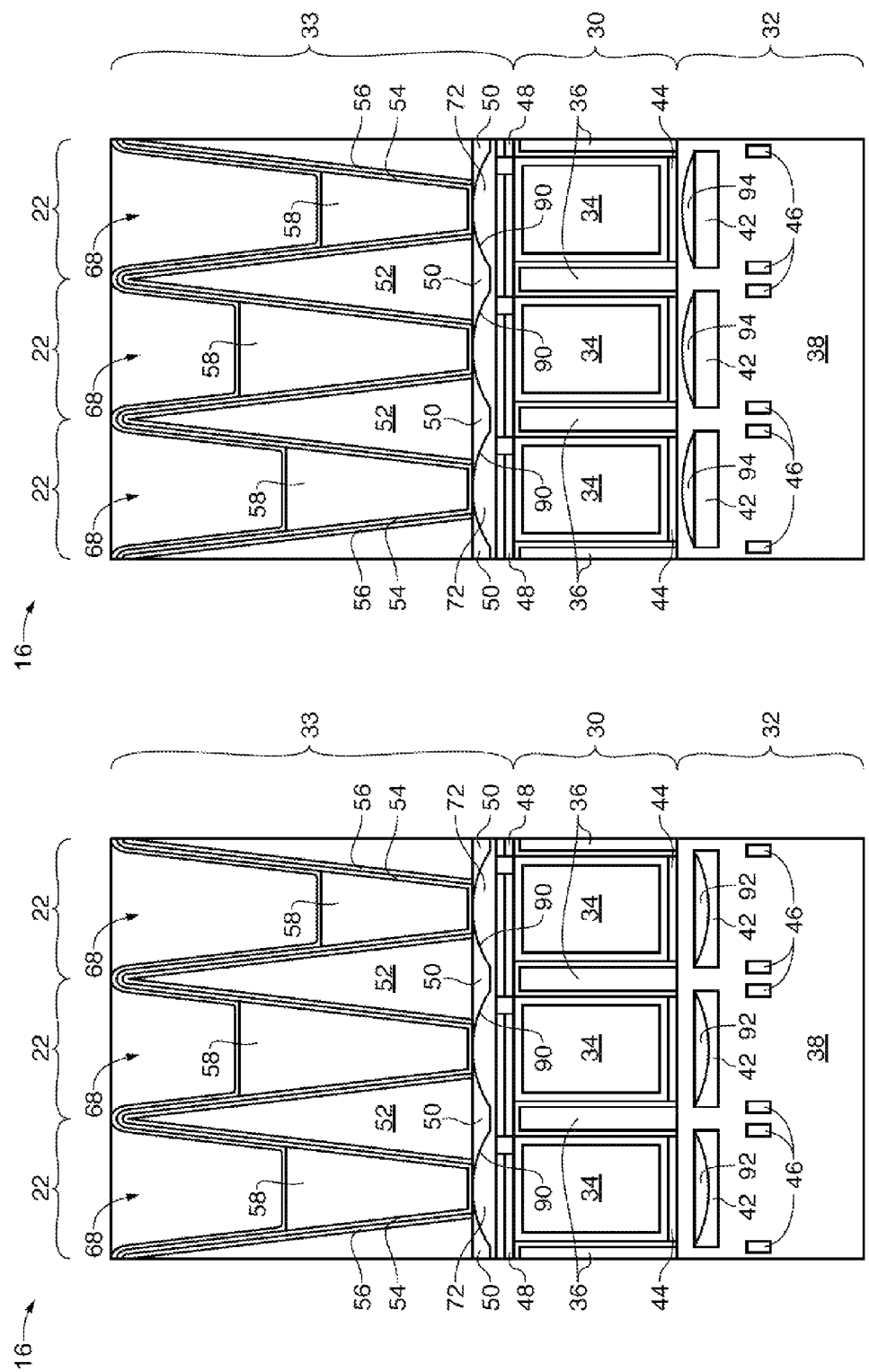

IMAGE SENSORS WITH REFLECTIVE OPTICAL CAVITY PIXELS

This application claims the benefit of provisional patent application No. 61/596,146, filed Feb. 7, 2012, which is hereby incorporated by reference herein in its entirety.

BACKGROUND

This relates generally to imaging sensors, and more particularly, to imaging sensors with optical cavity image pixels.

Modern electronic devices such a cellular telephones, cameras, and computers often use digital image sensors. Imagers (i.e., image sensors) may be formed from a two-dimensional array of image sensing pixels. Each pixel may include a photosensor such as a photodiode that receives incident photons (light) and converts the photons into electrical charges. Conventional image pixel arrays include frontside illuminated image pixels or backside illuminated image pixels. Image pixels are fabricated on a semiconductor substrate using complementary metal-oxide-semiconductor (CMOS) technology or charge-coupled device (CCD) technology. The image sensors may include photodiodes and other operational circuitry such as transistors formed in a front surface of the substrate. In a configuration that includes frontside illuminated image pixels, a dielectric stack is formed on the front surface of the substrate directly on top of the photodiodes. The dielectric stack includes metal routing lines and metal vias formed in dielectric material. Image light passes through the dielectric stack to the photodiodes. In a configuration that includes backside illuminated image pixels, the photodiodes receive image light through the backside of the semiconductor substrate so that the light does not pass through the dielectric stack.

However, in conventional frontside and backside illuminated image pixels, the image light only makes a single pass through the semiconductor substrate. For this reason, some of the light can pass through the photodiode without being converted into detectable electric charge. This undetected light can negatively affect the quantum efficiency of the pixel and can limit the performance of the device, particularly in low-light imaging operations. Additionally, some of the light may be scattered or diffracted into neighboring pixels and/or photon-generated charge may diffuse into neighboring pixels thus creating pixel crosstalk and further degrading the performance.

It would therefore be desirable to be able to provide improved image pixels for imaging devices.

BRIEF DESCRIPTION OF THE DRAWINGS

FIG. 3 is a cross-sectional view of a portion of an illustrative pixel array having optical cavity image pixels in accordance with an embodiment of the present invention.

FIG. 4 is a cross-sectional view of a portion of an illustrative pixel array having optical cavity image pixels with additional charge storage regions for global shutter operations in accordance with an embodiment of the present invention.

FIGS. 5-18 are diagrams showing illustrative intermediate processing stages of a backside illuminated optical cavity image pixel array during manufacturing operations in accordance with an embodiment of the present invention.

FIG. 19 is a diagram of the optical cavity image pixels of FIG. 18 showing how color filter material may be formed in light guide structures of the image pixels to form color optical cavity image pixels in accordance with an embodiment of the present invention.

FIG. 20 is a cross-sectional side view of a portion of an illustrative optical cavity image pixel array having concave reflective structures in accordance with an embodiment of the present invention.

FIG. 21 is a cross-sectional side view of a portion of an illustrative optical cavity image pixel array having convex reflective structures in accordance with an embodiment of the present invention.

DETAILED DESCRIPTION

Electronic devices such as digital cameras, computers, cellular telephones, and other electronic devices include image sensors that gather incoming light to capture an image. The image sensors may include arrays of image pixels. The image pixels in the image sensors may include photosensitive elements such as photodiodes that convert the incoming light into electric charge. The electric charges may be stored and converted into image signals. Image sensors may have any number of pixels (e.g., hundreds or thousands or more). A typical image sensor may, for example, have hundreds of thousands or millions of pixels (e.g., megapixels). Image sensors may include control circuitry such as circuitry for operating the imaging pixels and readout circuitry for reading out image signals corresponding to the electric charge generated by the photosensitive elements.

Image sensors may be provided with one or more arrays of optical cavity image pixels (sometimes referred to herein as optical cavity image sensor pixels, optical cavity pixels, image pixels, or pixels). Optical cavity image pixels may include photosensitive elements formed in a substrate and a reflective chamber (cavity) formed from reflective structures in the substrate that at least partially surround the photosensitive elements and reflect light that has passed through the photosensitive element back onto the photosensitive element. In this way, additional light may be absorbed by the photosensitive element on subsequent passes onto the photosensitive element. Optical cavity image pixels may also include a light guiding structure that guides light into the reflective chamber.

Figure 1:
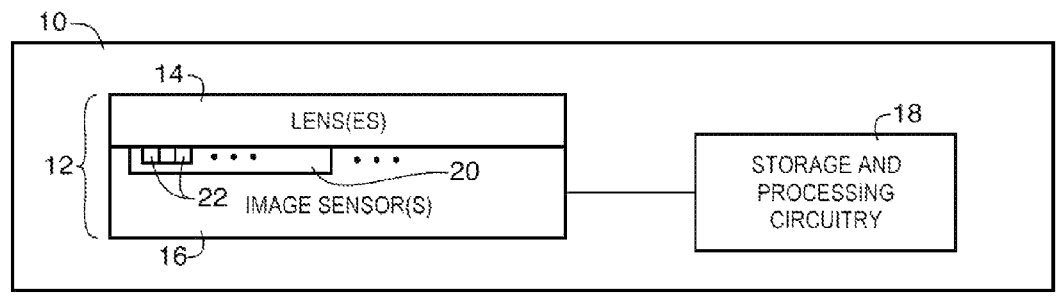
FIG. 1 is a diagram of an illustrative electronic device in accordance with an embodiment of the present invention.

FIG. 1 is a diagram of an illustrative electronic device that uses an image sensor to capture images. Electronic device 10 of FIG. 1 may be a portable electronic device such as a camera, a cellular telephone, a video camera, or other imaging device that captures digital image data. Camera module 12 may be used to convert incoming light into digital image data. Camera module 12 may include one or more lenses 14 and one or more corresponding image sensors 16. During image capture operations, light from a scene may be focused onto image sensor 16 by lens 14. Image sensor 16 provides corresponding digital image data to processing circuitry 18. Image sensor 16 may, for example, be a backside illumination image sensor. If desired, camera module 12 may be provided with an array of lenses 14 and an array of corresponding image sensors 16.

Control circuitry such as storage and processing circuitry 18 may include one or more integrated circuits (e.g., image processing circuits, microprocessors, storage devices such as random-access memory and non-volatile memory, etc.) and may be implemented using components that are separate from camera module 12 and/or that form part of camera module 12 (e.g., circuits that form part of an integrated circuit that includes image sensors 16 or an integrated circuit within module 12 that is associated with image sensors 16). Image data that has been captured by camera module 12 may be processed and stored using processing circuitry 18. Processed image data may, if desired, be provided to external equipment (e.g., a computer or other device) using wired and/or wireless communications paths coupled to processing circuitry 18. Processing circuitry 18 may be used in controlling the operation of image sensors 16.

Image sensors 16 may include one or more arrays 20 of image pixels 22. Image pixels 22 may be formed in a semiconductor substrate using complementary metal-oxide-semiconductor (CMOS) technology or charge-coupled device (CCD) technology or any other suitable photosensitive devices. Image pixels 22 may be frontside illumination (FSI) image pixels or backside illumination (BSI) image pixels. In one suitable example that is sometimes described herein, image pixels 22 are backside illumination optical cavity image pixels.

Figure 2:
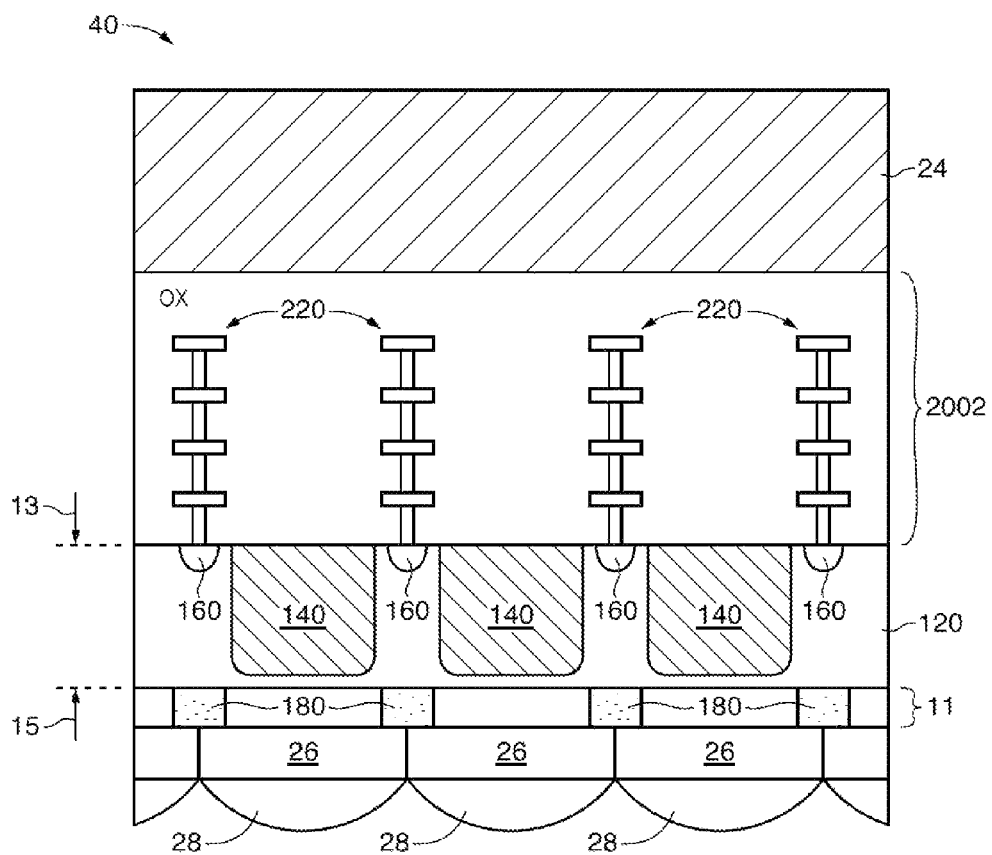
FIG. 2 is a diagram of conventional backside illuminated image pixels.

FIG. 2 is a cross-sectional side view of a portion of an array 40 of conventional backside illumination image sensor pixels. Each pixel has a photodiode 140 formed in a front side of p-type epitaxial silicon substrate 120. Each pixel also has an associated floating diffusion region 160 formed in the front side of substrate 120.

A dielectric stack 2002 is formed on front surface 13 of substrate 120. Dielectric stack 2002 includes metal interconnect structures 220 formed in dielectric material (e.g., silicon dioxide). A silicon carrier board 24 is formed on dielectric stack 2002.

A color filter array 26 is formed on back surface 15 of substrate 120. A respective microlens 28 covers each color filter pixel element 26. Each pixel has a metal light ring 180 formed on the back surface of substrate 120 in a dielectric layer 11. Metal light ring 180 lines the perimeter of each color filter 26 and serves as a light block to prevent pixel crosstalk.

Light can enter from the back side of the image sensor pixels through microlenses 28. The incoming light is partially absorbed by photodiode 140. The remaining portion of the incoming light penetrates through substrate 120 into dielectric stack 2002. The remaining portion of the incoming light may be lost within layer 120 or may reflect off of interconnect structures 220 and into an adjacent photodiode 140, resulting in pixel crosstalk.

In order to increase the amount of light that is absorbed by a photodiode in a backside illuminated image sensor and decrease pixel crosstalk, an image sensor such as image sensor 16 of imaging system 10 of FIG. 1 may be provided with optical cavity image pixels of the type shown in FIG. 3.

As shown in FIG. 3, optical cavity image pixels 22 may each include a portion of an image sensor substrate such as substrate 30, a dielectric stack such as intermetal dielectric layer (sometimes referred to as an intermetal dielectric stack, an interlayer dielectric or ILD) 32, and a light-guiding layer such as layer 33.

Photosensitive elements such as photodiodes 34 may be formed in substrate 30 (e.g., a silicon semiconductor substrate). A reflective cavity may be formed around each photodiode so that light that enters substrate 30 is either absorbed by photodiode 34 or reflected from reflecting structures such as reflective structures 36, 42, and/or 50 until the light is absorbed by photodiode 34.

As shown in FIG. 3, the reflective cavity for each photodiode is formed from vertical reflectors 36 formed in substrate 30, a frontside reflector 42 in ILD 32, and backside reflectors 50 that at least partially cover each photodiode 34. ILD 32 may include conductive interconnects 46 that route image signals from photodiodes 34 to circuitry such as storage and processing circuitry 18. Interconnects 46 may be formed in one or more layers of dielectric material 38. Interconnects 46 may be formed from copper, aluminum, tungsten, or other conductive materials.

Image sensor 16 may be provided with coating such as antireflective material 44 that is interposed between substrate 30 and ILD 32 and antireflective material 48 that is interposed between substrate 30 and light-guiding layer 33. Coatings 48 may help increase the amount of light that is transmitted through the interface between light-guiding layers 33 and substrate 30. Coating 44 may help increase the amount of light that is transmitted through the interface between substrate 30 and ILD 32, thereby increasing the amount of light that is reflected by frontside reflectors 42 back onto photodiodes 34.

Frontside reflectors 42 and/or backside reflectors 50 may be formed from metal (e.g., aluminum or tungsten). Vertical reflectors 36 may be formed from metal, oxide materials (e.g., silicon dioxide), or other suitable reflective materials. Vertical reflectors 36 may be formed in substrate 30 using deep trench formation techniques. Vertical reflectors 36 may also help electrically and optically isolate one pixel from neighboring pixels, thereby reducing electrical and optical crosstalk between pixels that can reduce the quality of image data obtained using the pixels.

Image sensor 16 may include ground contacts 70 that couple photodiodes 34 to a ground plane or other ground structure for the image sensor.

As shown in FIG. 3, light-guiding layers 33 may include light-guide trenches 68 that guide light into the reflective cavities formed by reflectors 42, 36, and 50 around photodiodes 34. Light-guide trenches 68 may be openings that have been etched into a material such as material 52 (e.g., a dielectric material, silicon, silicon oxide, or other suitable material). As shown in FIG. 3, light-guide trenches 68 may have a substantially conical shape. Dashed lines 64 show how image light may be reflected by the walls of trenches 68 into the reflective cavity around a photodiode and reflected within the reflective cavity until being absorbed by the photodiode. Coatings such as antireflective coating 54 may be formed on the surfaces (e.g., walls, floor) of trenches 68 that help increase the amount of light that is transmitted from trenches 68 through dielectric material 72 and into substrate 30.

Each light-guide trench 68 may be filled or partially filled with color filter material 58 (e.g., red (R) color filter material, blue (B) color filter material, green (G) color filter material or other color filtering material such as colored photoresist). Color filter elements 58 may be arranged to form an array of color optical cavity image pixels arranged in a pattern such as a Bayer color filter pattern.

An additional coating such as antireflective coating 60 may be formed over color filter elements 58 and portions of coating 54. Coating 60 may help increase the amount of light that is transmitted from air gap 62 in each trench 68 into color filter material 58. However, this is merely illustrative. If desired, pixels 22 may be monochromatic image pixels that are free of color filter material 58 and additional coating 60.

If desired, sidewalls of light-guide trenches 68 may be coated with reflective material 56 that is interposed between dielectric material 52 and antireflective coating 54. Reflective material 56 may help reflect light downward through trenches 68 into reflective cavities for photodiodes 34. However, this is merely illustrative. If desired, pixels 22 may be provided without any reflective coating 56 or any antireflective coating on the sidewalls of trenches 68. If desired, image sensor 16 may be provided with a transparent cover layer such as cover layer 66 over pixels 22. However, this is merely illustrative. If desired, pixels 22 may be provided without any cover layer.

FIG. 4 shows an image sensor such as image sensor 16 that has been configured as a global shutter image sensor having optical cavity image pixels. As shown in FIG. 4, each pixel 22 includes a storage node 82 that is separated from an associated light-sensing element 34 by a vertical reflector 36 formed from a deep trench isolation operation. Each storage node 82 may be enclosed by reflectors 36, 50, and additional frontside reflectors 42. The frontside reflectors 42 associated with each storage node 82 may be separated from adjacent frontside reflectors 42 associated with a photodiode 34.

Each storage node 82 may be completely enclosed by reflectors 36, 50, and 42 so that no image light can reach storage nodes 82. Each storage node 82 may be configured to receive and store electric charges generated by photodiodes 34 in response to image light. A storage gate such as storage gate 80 may be provided that controls the transfer of charges from photodiodes 34 to storage nodes 82. Image signals based on the charges stored in storage nodes 82 may be transmitted to processing circuitry using interconnects 46. Each storage node 82 may be formed as a diffused diode.

FIGS. 5-19 show cross-sectional views of pixels 22 of pixel array 20 at various intermediate processing steps during formation of image sensor 16.

Figure 5:
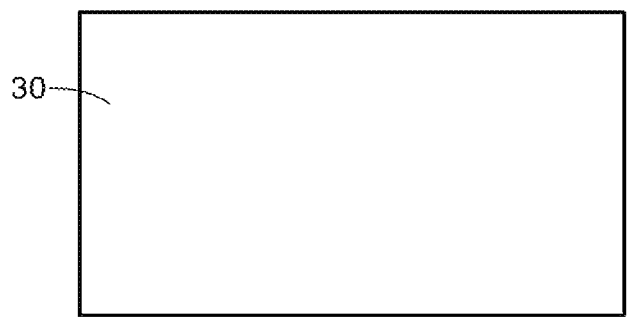

As shown in FIG. 5 a substrate such as substrate 30 (e.g., a silicon semiconductor substrate) may be provided.

Figure 6:
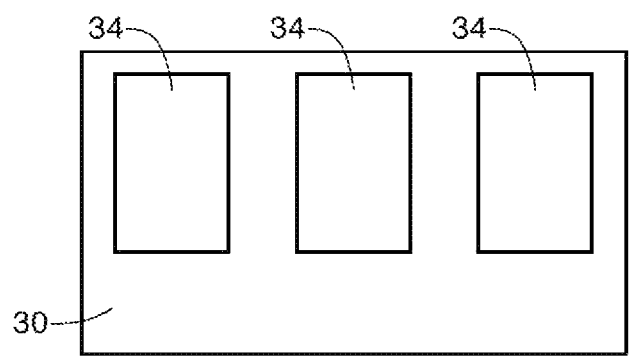

As shown in FIG. 6, photodiodes 34 may be formed in the silicon substrate (e.g., using semiconductor doping techniques).

Figure 7:
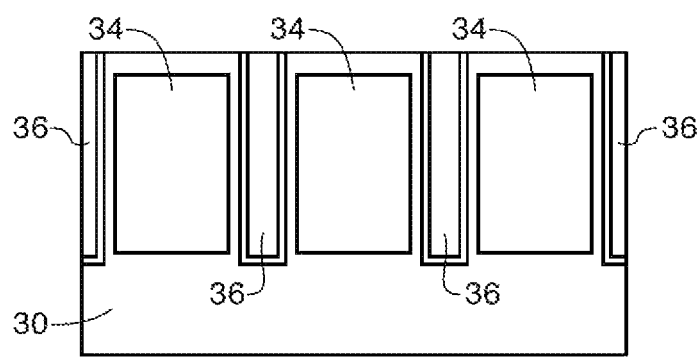

As shown in FIG. 7, sidewall (vertical) reflectors 36 may be formed around photodiodes 34 in substrate 30. Reflectors 36 may be formed by performing a patterned deep etch to form openings around photodiodes 34 and filling the etched openings with reflective dielectric material such as silicon dioxide. If desired, other reflective materials such as metals (e.g., aluminum, tungsten) may be used in forming reflectors 36.

Figure 8:
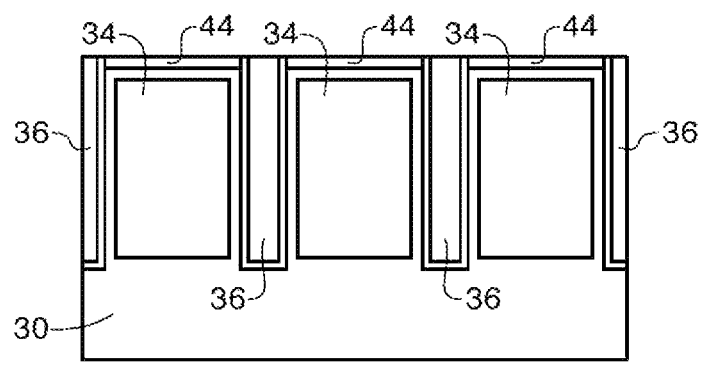

As shown in FIG. 8, a layer of antireflective material such as antireflective coating 44 (e.g., silicon nitride) may be formed over the photodiodes on substrate 30.

Figure 9:
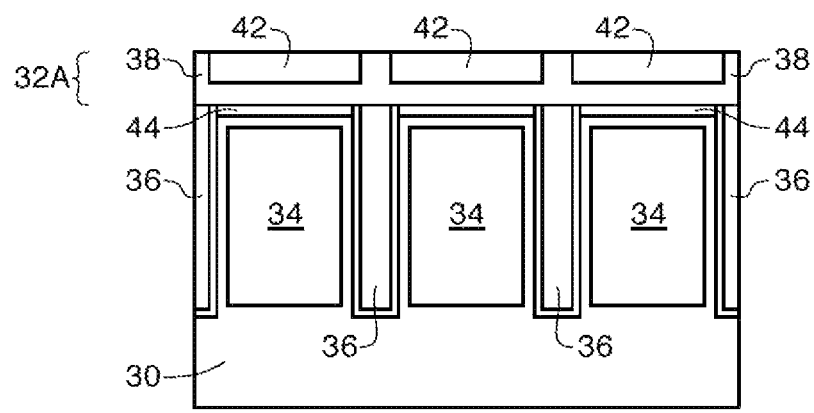

As shown in FIG. 9, a portion 32A of intermetal dielectric layer 32 containing frontside reflectors 42 may be formed over antireflective coating 44 (e.g., by depositing dielectric material 38 over the antireflective coating, etching recesses in the dielectric material, and filling the recesses with reflective material such as aluminum or tungsten to form frontside reflectors 42).

Figure 10:
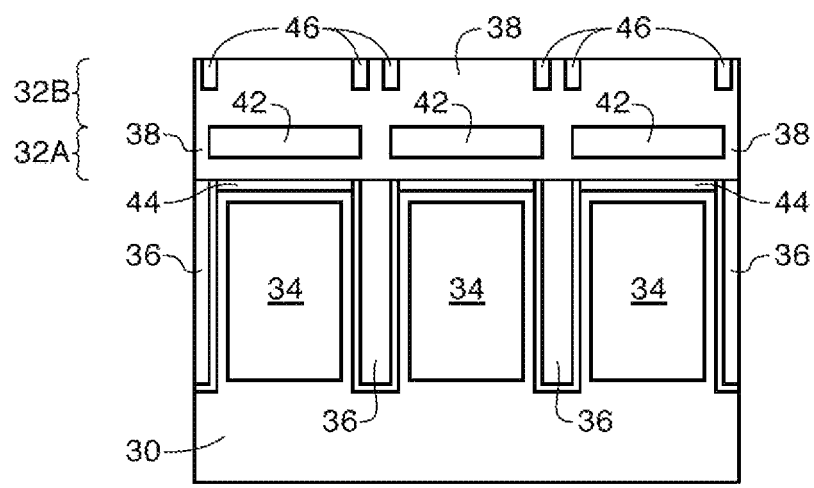

As shown in FIG. 10, additional portion 32B of layer 32 containing conductive interconnects 46 may then be formed over portion 32A (e.g., by depositing additional dielectric material, etching openings the additional dielectric material, and forming conductive material such as copper, aluminum or tungsten in the etched openings to form metal routing interconnects 46). If desired, an image sensor may be provided with one, two, three, or more than three layers of interconnects 46 embedded in dielectric material 38.

Figure 11:
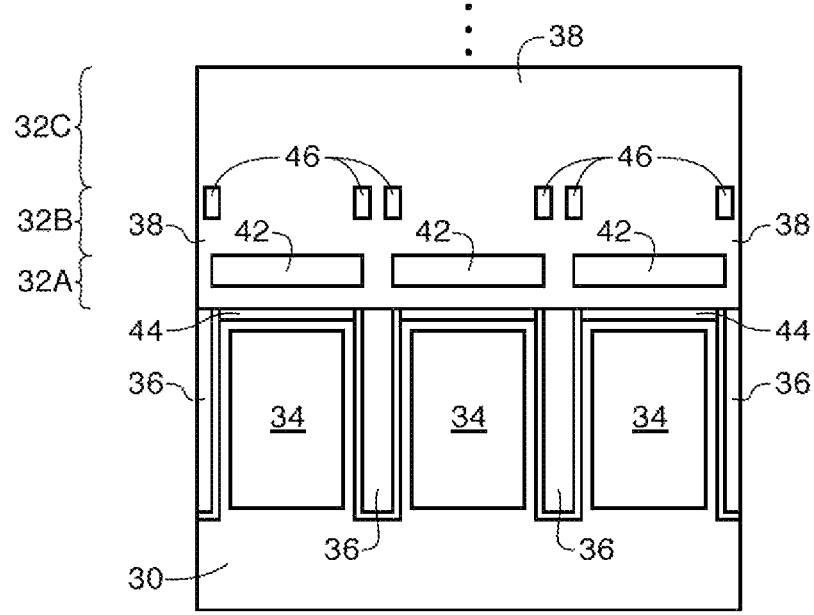

As shown in FIG. 11, additional portions such as portion 32C of layer 32 may be formed over portion 32B. Portion 32C may include only dielectric material 38 or may include additional layers of metal interconnects.

Figure 12:
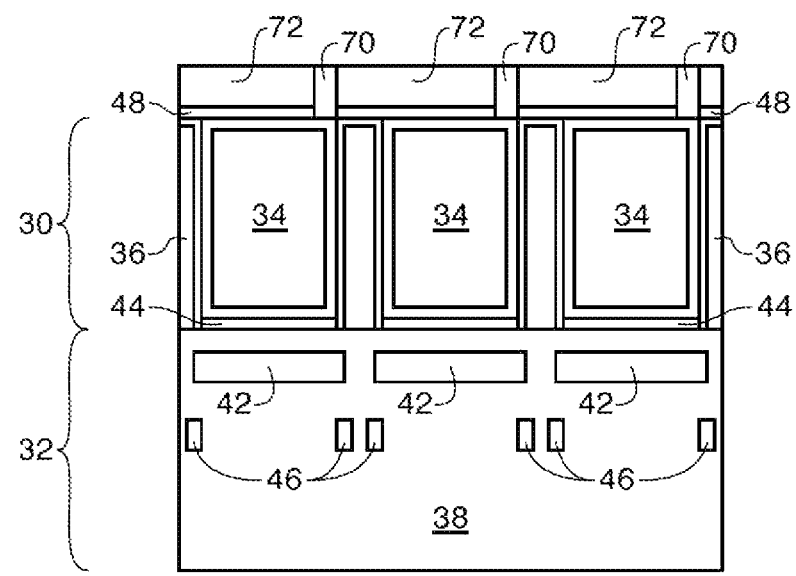

As shown in FIG. 12, the partially formed image sensor of FIG. 11 may then be flipped, backside thinned and provided with antireflective coating 48, dielectric layer 72, and ground contacts 70 on an opposing side of substrate 30 (e.g., a side of substrate 30 that is opposite to the side on which ILD 32 is attached). Antireflective coating 48, dielectric layer 72, and ground contacts 70 may be formed on substrate 30 by depositing coating 48, depositing dielectric material 72 over coating 48, etching openings in dielectric material 72 and coating 48, and forming conductive material such as copper, aluminum, or tungsten in the etched openings to form conductive contacts 70. If desired, other processing steps such as polishing, chemical-mechanical planarization (CMP), or other suitable semiconductor processing steps may be performing during formation of image sensor 16.

Figure 13:
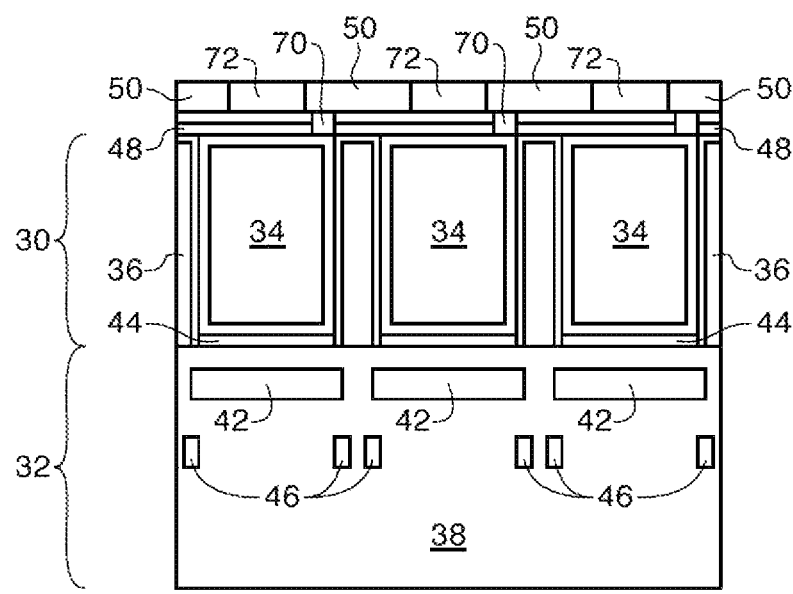

As shown in FIG. 13, backside reflectors 50 may then be formed in dielectric material 72 (e.g., by etching additional openings in material 72, filling the additional openings with reflective material such as aluminum or tungsten, and polishing the reflective material to form reflectors 50).

Figure 14:
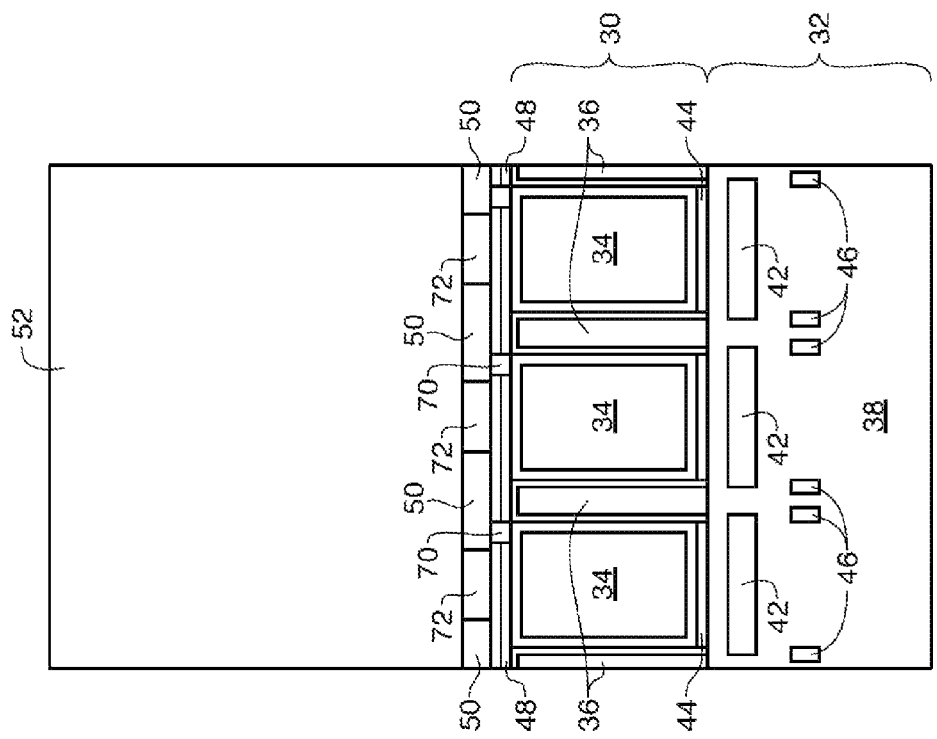

As shown in FIG. 14, material 52 may then be deposited over dielectric material 72 and reflectors 50. Material 52 may be silicon, silicon dioxide, or other suitable materials for forming light-guide trenches.

Figure 15:
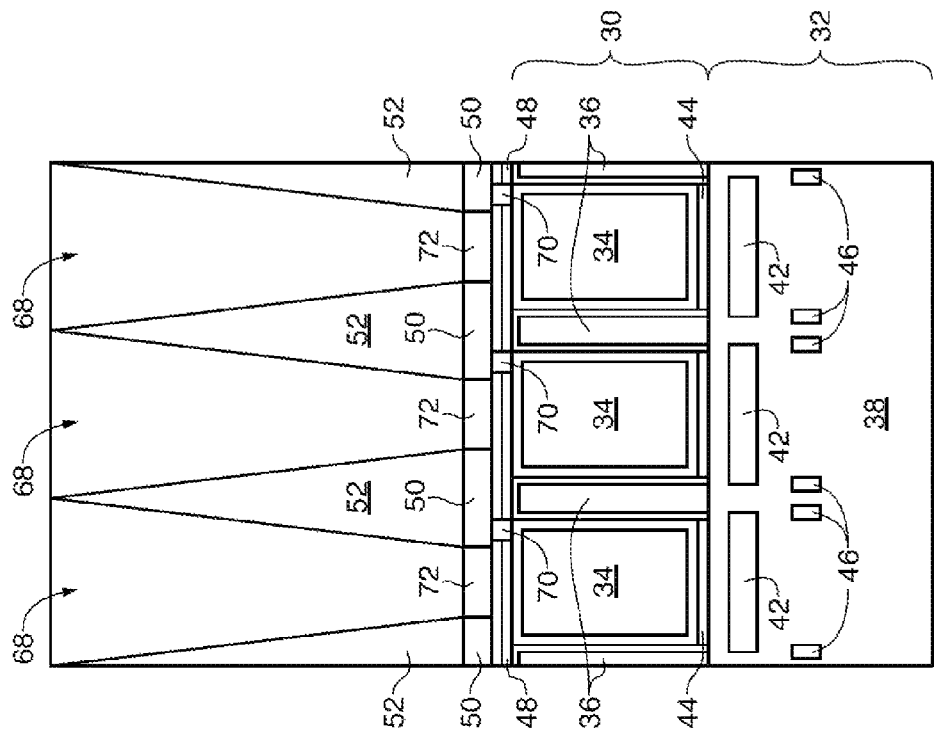

As shown in FIG. 15, light-guide trenches 68 may be formed in material 52 (e.g., by performing a selective dry or wet etch to form openings in material 52 that extend from a top surface of material 52 to dielectric layer 72).

Figure 16:
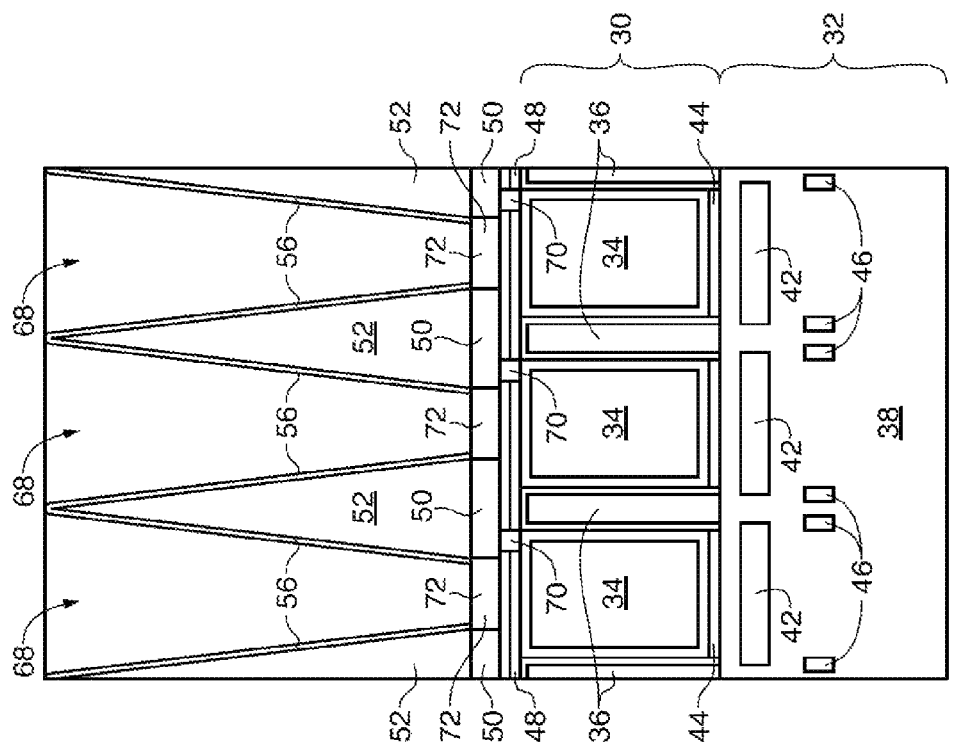

As shown in FIG. 16, if desired, an optional thin metal layer such as reflective layer 56 (e.g., aluminum, copper or tungsten) may be formed on the surfaces of trenches 68 including bottom portions 56' on the floors of trenches 68. An electroplating process, a chemical vapor deposition (CVD) process, or other suitable process may be used to from layer 56 in trenches 68.

Figure 17:
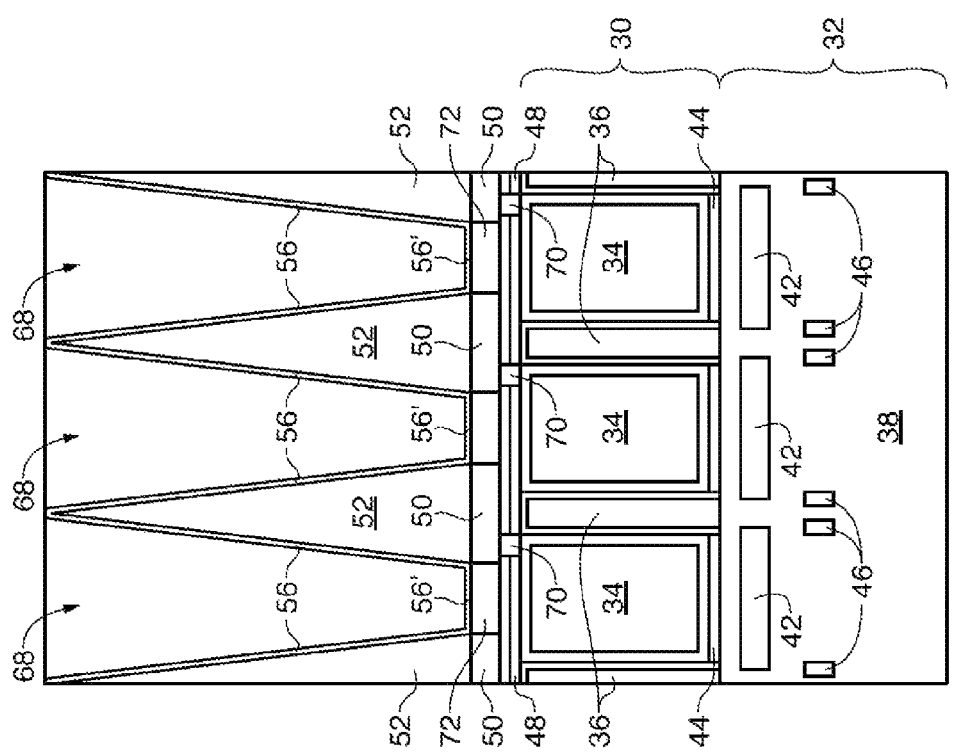

As shown in FIG. 17, in situations in which layer 56 has been formed on the surfaces of trenches 68, bottom portion 56' may be removed (etched) from the floors of trenches 68 to allow light to pass from trenches 68 into substrate 30. The steps shown in FIGS. 16 and 17 are merely illustrative. Because materials such as silicon in which trenches 68 may be formed are reflective, particularly at large angles of incidence, trenches 68 may be provided without any reflective coating.

As shown in FIG. 18, antireflective material such as antireflective coating 54 (e.g., silicon nitride, silicon oxide, alternating layers of silicon nitride and silicon oxide or other antireflective materials) may be formed over the surfaces of trenches 68 (e.g., over reflective coating 56 on sidewalls of trenches 68 and over dielectric material 72 at the floor of trenches 68. Optical cavity image pixels arranged in the configuration shown in FIG. 18 may be implemented in an image sensor such as image sensor 16 as monochromatic (clear) optical cavity image pixels. However, if desired, color filter material may be formed in trenches 68 to form color optical cavity image pixels as shown in FIG. 19.

As shown in FIG. 19, color filter material 58 (e.g., colored photoresists, alternating thin-film layers that selectively block light of some wavelengths while passing light of other wavelengths) may be formed in trenches 68. An additional layer of antireflective material such as antireflective coating 60 (e.g., silicon nitride, silicon oxide, alternating layers of silicon nitride and silicon oxide or other antireflective materials) may be formed over portions of color filter elements 58 and over portions of antireflective layer 54. Optical cavity image pixels arranged in the configuration shown in FIG. 19 may be implemented in an image sensor such as image sensor 16 as color optical cavity image pixels.

The frontside and backside reflectors of (as examples) FIGS. 3 and 4 are merely illustrative. As shown in FIG. 20, frontside reflectors 42 may be provided with a concave reflective surface 92. The concave shape of surface 92 may help prevent light leakage due to edge effects associated with flat reflectors for light of relatively short wavelengths. As shown in FIG. 21, frontside reflectors 42 may, alternatively, be provided with a convex reflective surface 94. The convex shape of surface 94 may help prevent light leakage due to edge effects associated with flat reflectors for light of relatively long wavelengths. In the examples of FIGS. 20 and 21, backside reflectors 50 are formed with a concave reflective surface 90. An optical cavity image pixel may be formed with any suitable combination of flat, convex, and/or concave reflectors for forming a reflective cavity that surrounds a photosensitive element such as a photodiode.

Figure 22:
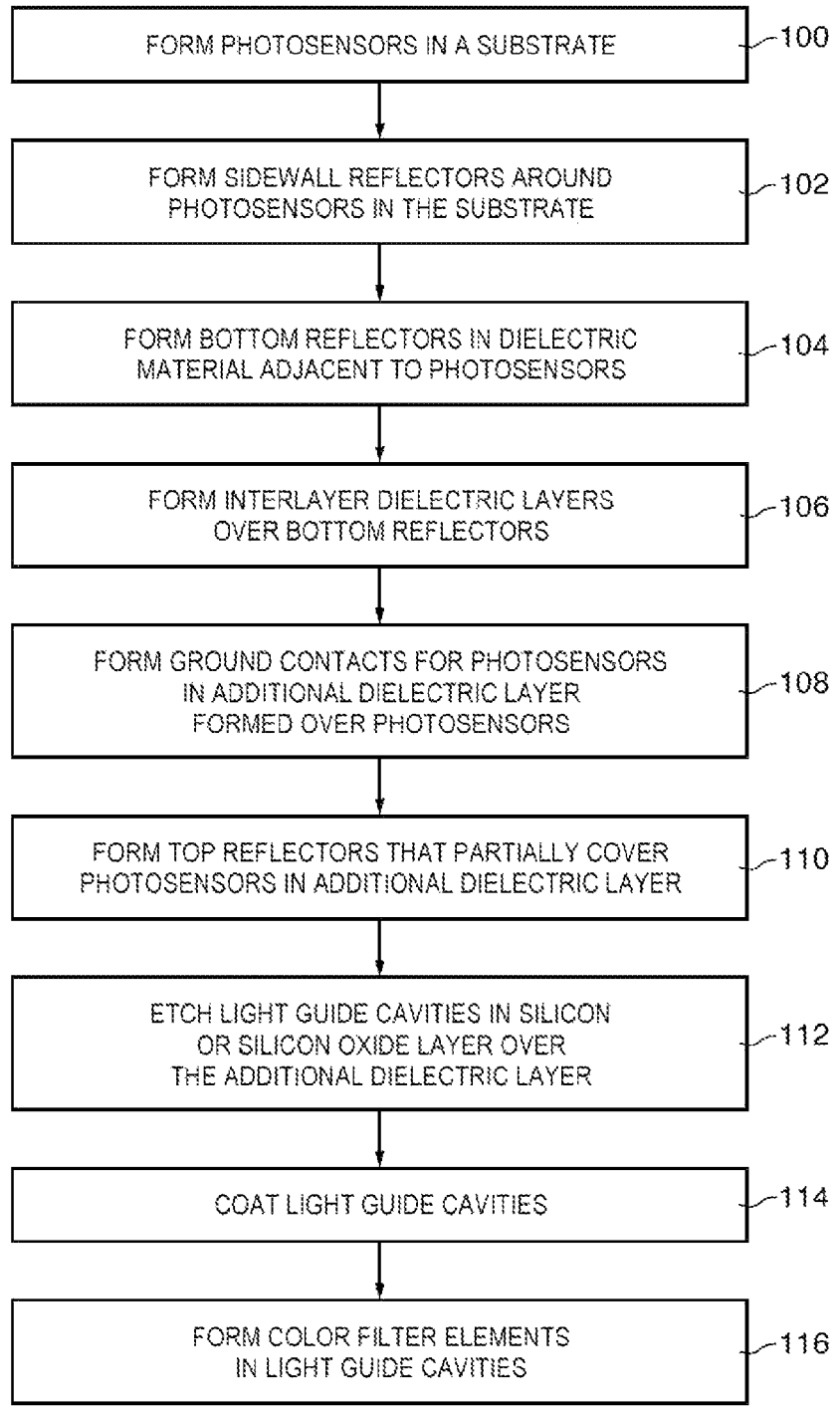
FIG. 22 is a flow chart of illustrative steps involved in forming optical cavity image pixels in accordance with an embodiment of the present invention.

FIG. 22 is a flowchart of illustrative steps involved in forming optical cavity image sensor pixels for an image sensor such as image sensor 16 of FIG. 1.

At step 100, an array of photosensors such as an array of photodiodes may be formed on a substrate such as a silicon substrate. If desired, additional storage diodes associated with each photodiode may also be formed in the substrate.

At step 102, sidewall reflectors such as reflectors 36 for a reflective cavity for each photosensor may be formed around the photosensors in the substrate. Sidewall reflectors may also be formed around additional storage diode if they have been formed in the substrate. Sidewall reflectors may be formed using deep trench formation operations.

At step 104, bottom (frontside) reflectors such as reflectors 42 may be formed in dielectric material adjacent to the photosensors. An antireflective layer may be formed over the photosensors prior to forming the bottom reflectors in the dielectric material over the photosensors.

At step 106, an intermetal dielectric stack such as ILD 32 may be formed over the bottom reflectors. The bottom reflectors may be embedded or partially embedded in the intermetal dielectric stack.

At step 108, ground contacts such as contacts 70 for the photosensors may be formed in an additional dielectric layer such as layer 72 that is formed over the photosensors on an opposing side of the substrate.

At step 110, top (backside) reflectors such as reflectors 50 that at least partially cover the photosensors may be formed in the additional dielectric layer.

At step 112, light guide cavities such as light-guide trenches 68 may be formed in a dielectric, silicon or silicon oxide layer over the additional dielectric layer.

At step 114, the light guide cavities formed at step 112 may be coated with reflective material 56 that enhances the reflectivity of the sidewall surfaces of the light guide cavities and/or antireflective coatings such as coatings 54 and/or 60 that enhance the amount of light that passes from the light guide cavities into the substrate.

At step 116, color filter elements such as color filter elements 58 may be formed in the light guide cavities. If desired, additional antireflective material may be formed over the color filter elements.

Figure 23:
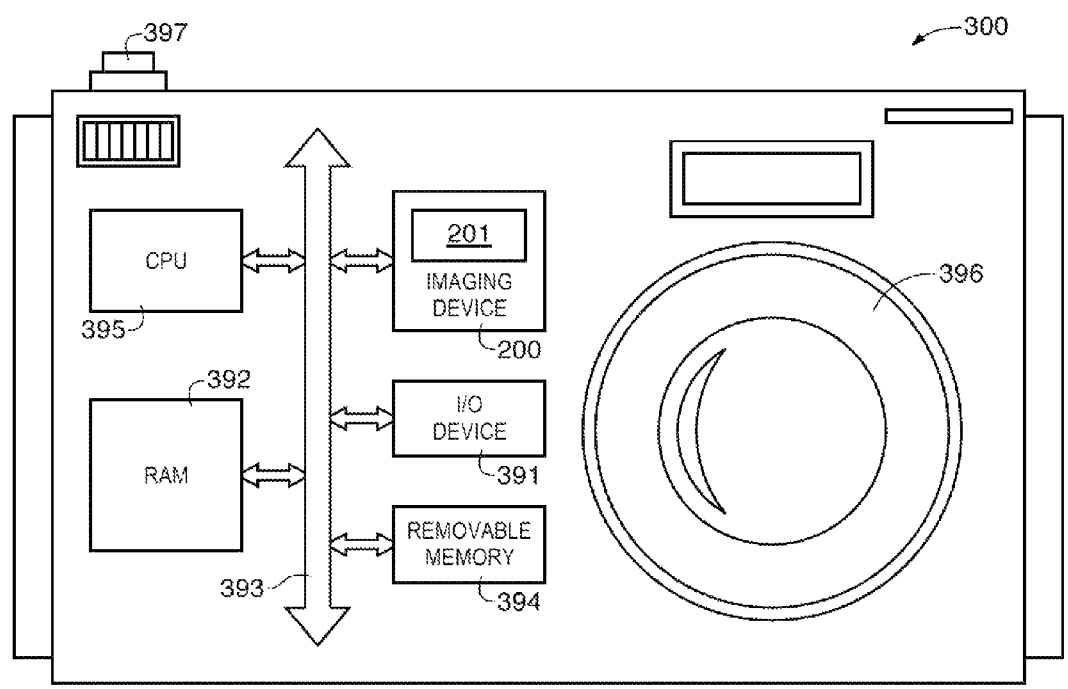
FIG. 23 is a block diagram of an imager that may employ the embodiments of FIGS. 1-22 in accordance with an embodiment of the present invention.

FIG. 23 shows, in simplified form, a typical processor system 300, such as a digital camera, which includes an imaging device 200. Imaging device 200 may include a pixel array 201 of the type shown in FIG. 1 (e.g., pixel array 201 may be an implementation of pixel array 22 of FIG. 1) having optical cavity image pixels as described above. Processor system 300 is exemplary of a system having digital circuits that may include imaging device 200. Without being limiting, such a system may include a computer system, still or video camera system, scanner, machine vision, vehicle navigation, video phone, surveillance system, auto focus system, star tracker system, motion detection system, image stabilization system, and other systems employing an imaging device.

Processor system 300, which may be a digital still or video camera system, may include a lens such as lens 396 for focusing an image onto a pixel array such as pixel array 201 when shutter release button 397 is pressed. Processor system 300 may include a central processing unit such as central processing unit (CPU) 395. CPU 395 may be a microprocessor that controls camera functions and one or more image flow functions and communicates with one or more input/output (I/o) devices 391 over a bus such as bus 393. Imaging device 200 may also communicate with CPU 395 over bus 393. System 300 may include random access memory (RAM) 392 and removable memory 394. Removable memory 394 may include flash memory that communicates with CPU 395 over bus 393. Imaging device 200 may be combined with CPU 395, with or without memory storage, on a single integrated circuit or on a different chip. Although bus 393 is illustrated as a single bus, it may be one or more buses or bridges or other communication paths used to interconnect the system components.

Various embodiments have been described illustrating image sensors that have optical cavity image pixels and methods for forming those optical cavity image pixels. Image sensors with optical cavity image pixels may be used in an imaging system such as an electronic device.

An optical cavity image pixel may include a photosensitive element in a substrate and a reflective cavity formed from reflectors that at least partially surround the photosensitive element. The reflectors may be formed in the substrate and/or in additional image sensor layers adjacent to the substrate. The reflective cavity may be formed from a bottom (frontside) reflector that is embedded in an intermetal dielectric stack, a top (backside reflector) formed in a dielectric layer above the photosensor that partially covers the photosensor, and vertical (sidewall) reflectors formed in the substrate between adjacent photosensors using deep trench isolation techniques.

Each optical cavity image pixel may also include a light-guide trench above the photosensor that guides light into the reflective cavity for that pixel. The light-guide trench may be an etched trench in a silicon or silicon dioxide layer formed over the photosensors. Each light-guide trench may include reflective or antireflective materials on the surfaces of the trench. Each optical cavity pixel may also include color filtering material in the trench that filters the light that passes through the color filter material into the reflective cavity. Light that is guided into the reflective cavity by the light-guide trench may experience multiple reflections from the reflectors of the reflective cavity before being absorbed and detected by the photosensor.

Each optical cavity image pixel may also include an additional storage node in the photosensor that is surrounded by a closed reflective cavity formed from bottom, top, and sidewall reflectors.

The foregoing is merely illustrative of the principles of this invention which can be practiced in other embodiments.

What is claimed is:
1. An optical cavity image pixel, comprising:
   a substrate;
   a photosensitive element formed in the substrate;
   reflective structures in the substrate that at least partially surround the photosensitive element;

additional reflective structures formed on opposing sides of the substrate;

a light-guide trench that guides image light into a reflective cavity formed from the reflective structures and the additional reflective structures; and dielectric material on a first side of the substrate, wherein a first one of the additional reflective structures is formed in the dielectric material between the photosensitive element and the light-guide trench.

2. The optical cavity image pixel defined in claim 1, further comprising additional dielectric material formed on an opposing second side of the substrate, wherein a second one of the additional reflective structures is formed in the additional dielectric material.

3. The optical cavity image pixel defined in claim 2, further comprising a layer of silicon formed over the dielectric material, wherein the light-guide trench has been etched into the layer of silicon.

4. The optical cavity image pixel defined in claim 2, further comprising color filter material in the light guide trench.

5. The optical cavity image pixel defined in claim 4 wherein the color filter material comprises a colored photoresist.

6. The optical cavity image pixel defined in claim 4 wherein the color filter material comprises a plurality of thin films.

7. The optical cavity image pixel defined in claim 2, further comprising a reflective coating on sidewall surfaces of the light-guide trench.

8. The optical cavity image pixel defined in claim 1, further comprising an associated storage node in the substrate.

9. The optical cavity image pixel defined in claim 8, further comprising further additional reflective structures that at least partially surround the associated storage node.

10. The optical cavity image pixel defined in claim 9, further comprising a storage gate that transfers charge from the photosensitive element to the associated storage node.

11. The optical cavity image pixel defined in claim 1, wherein the substrate comprises a silicon substrate and wherein the reflective structures and the photosensitive elements are formed in the silicon substrate.

12. The optical cavity image pixel defined in claim 2, wherein the substrate has third and fourth opposing sides, wherein a first one of the reflective structures is formed on the third side of the substrate, and wherein a second one of the reflective structures is formed on the fourth side of the substrate.

13. The optical cavity image pixel defined in claim 12, wherein the second one of the additional reflective structures has a convex reflective surface, and wherein the first one of the additional reflective structures has a concave reflective surface.

14. A system, comprising:
a central processing unit;
memory;
input-output circuitry; and
an imaging device having an array of optical cavity image pixels, wherein each optical cavity image pixel comprises:
a photosensitive element formed in a substrate;
a reflective cavity that at least partially surrounds the photosensitive element, wherein the reflective cavity comprises a frontside reflector, a backside reflector, and a plurality of vertical sidewall reflectors;
a light-guide trench that guides image light into the reflective cavity, wherein at least a portion of the backside reflector is interposed between the photosensitive element and the light-guide trench; and
dielectric material on a first side of the substrate, wherein the backside reflector is formed in the dielectric material between the photosensitive element and the light-guide trench.

15. The system defined in claim 14 wherein the imaging device further comprises an intermetal dielectric stack, and wherein the frontside reflector is embedded in the intermetal dielectric stack.

16. The system defined in claim 15, further comprising a reflective layer formed on the surface of the light-guide trench that reflects light into the reflective cavity.

17. A method for forming an image sensor having a plurality of optical cavity image pixels, comprising:
forming photosensitive elements in a substrate;
forming vertical reflectors that are interposed between the photosensitive elements in the substrate;
forming at least one frontside reflector associated with each photosensitive element in a dielectric material on a first side of the substrate, wherein the frontside reflector has a convex reflective surface; and
forming at least one backside reflector associated with each photosensitive element in an additional dielectric material on an opposing second side of the substrate, wherein the backside reflector has a concave reflective surface.

18. The method defined in claim 17, further comprising:
forming a layer of material over the additional dielectric material; and
etching light-guide trenches into the layer of material, wherein each of the light-guide trenches is aligned with a selected one of the photosensitive elements.

* * * * *